United States Patent
Ohmi et al.

(10) Patent No.: US 7,329,609 B2
(45) Date of Patent: Feb. 12, 2008

(54) SUBSTRATE PROCESSING METHOD AND SUBSTRATE PROCESSING APPARATUS

(75) Inventors: Tadahiro Ohmi, Sendai (JP);
Shigetoshi Sugawa, Sendai (JP);
Masaki Hirayama, Sendai (JP)

(73) Assignees: Tadahiro Ohmi, Miyagi (JP); Tokyo Electron Limited, Tokyo (JP)

( * ) Notice: Subject to any disclaimer, the term of this patent is extended or adjusted under 35 U.S.C. 154(b) by 101 days.

(21) Appl. No.: 10/467,820

(22) PCT Filed: Dec. 10, 2002

(86) PCT No.: PCT/JP02/12926

§ 371 (c)(1),
(2), (4) Date: Aug. 11, 2004

(87) PCT Pub. No.: WO03/054949

PCT Pub. Date: Jul. 3, 2003

(65) Prior Publication Data
US 2005/0042869 A1    Feb. 24, 2005

(30) Foreign Application Priority Data
Dec. 13, 2001  (JP)  ............................ 2001-380535

(51) Int. Cl.
*H01L 21/302* (2006.01)
(52) U.S. Cl. .................. 438/710; 438/726; 438/727; 438/728; 438/730; 438/732
(58) Field of Classification Search ............... 438/726, 438/727, 728, 730, 732, 710; 118/723 ME
See application file for complete search history.

(56) References Cited

U.S. PATENT DOCUMENTS

| | | | |
|---|---|---|---|
| 5,685,949 A | | 11/1997 | Yashima |
| 5,965,035 A | * | 10/1999 | Hung et al. .................... 216/72 |
| 6,051,281 A | * | 4/2000 | Kobayashi et al. .......... 427/535 |
| 6,158,383 A | * | 12/2000 | Watanabe et al. ...... 118/723 AN |
| 6,337,289 B1 | * | 1/2002 | Narwankar et al. .......... 438/776 |
| 2001/0013607 A1 | * | 8/2001 | Miyasaka ..................... 257/66 |
| 2002/0009861 A1 | * | 1/2002 | Narwankar et al. ......... 438/404 |
| 2003/0027428 A1 | * | 2/2003 | Ng et al. ..................... 438/706 |

FOREIGN PATENT DOCUMENTS

| | | |
|---|---|---|
| JP | 7-283203 | 10/1995 |
| JP | 11-340202 | 12/1999 |
| JP | 2002-256858 | 9/2000 |
| JP | 2002-151486 | 5/2002 |

* cited by examiner

*Primary Examiner*—Binh X. Tran
(74) *Attorney, Agent, or Firm*—Finnegan, Henderson, Farabow, Garrett & Dunner, LLP (57) ABSTRACT

In a substrate processing apparatus, a control electrode (131) separates a process space (11C) including a substrate to be processed and a plasma formation space (11B) not including the substrate. The control electrode includes a conductive member formed in a processing vessel and having a plurality of apertures (131a) for passing plasma. A surface of the control electrode is covered by an aluminum oxide or a conductive nitride. In the substrate processing apparatus, a gas containing He and $N_2$ is supplied into the processing vessel. In the plasma formation space, there is formed plasma under a condition in which atomic state nitrogen N* are excited. The atomic state nitrogen N* are used to nitride a surface of the substrate.

9 Claims, 10 Drawing Sheets

SUBSTRATE PROCESSING METHOD AND SUBSTRATE PROCESSING APPARATUS

TECHNICAL FIELD

The present invention generally relates to plasma processing apparatuses and more particularly to a microwave plasma processing apparatus.

Plasma process and plasma processing apparatus constitute indispensable technology for fabricating ultrafine semiconductor devices such as the one called deep submicron device or deep sub-quarter micron device having a gate length near 0.1 μm or less, or for fabricating high-resolution flat panel display device including a liquid crystal display device.

Conventionally, various plasma excitation methods have been employed in the plasma processing apparatus used for fabricating semiconductor devices or liquid crystal display devices. Particularly, high-frequency plasma apparatuses of parallel plate type or induction-coupled type plasma apparatus are used commonly. However, such a conventional plasma processing apparatuses suffers from the problem of non-uniform plasma formation in that the region in which high electron density is achieved is substantially limited, and there has been a difficulty in conducting a uniform processing over the entire surface of the substrate with a large processing rate or throughput. This problem becomes particularly serious in the case of processing a substrate of large diameter. Further, such a conventional plasma processing apparatus has inherent problems, associated with its high electron temperature, in that damages are caused in the semiconductor devices formed on the substrate. Further, severe metal contamination may be caused as a result of sputtering of the chamber wall. Thus, it is becoming difficult with conventional plasma processing apparatuses to satisfy the stringent demand of further miniaturization and further improvement of productivity of semiconductor devices or flat display devices.

Meanwhile, there has been a proposal of a microwave plasma processing apparatus that uses high-density plasma excited, not by d.c. magnetic field, but by a microwave electric field. For example, there is a proposal of a plasma processing apparatus that excites plasma by emitting a microwave into a processing vessel from a planar antenna (radial line slot antenna) having a number of slots arranged so as to produce a uniform microwave, for emitting a microwave into a processing vessel. In this plasma processing apparatus, the microwave electric field induces plasma by causing ionization in the gas in the vacuum vessel. Reference should be made to Japanese Laid-Open Patent Application 9-63793. By using the microwave plasma excited according to such a process, it becomes possible to realize a high-plasma density over a wide area right underneath the antenna, and uniform plasma processing becomes possible with short time period. Further, the microwave plasma thus excited has an advantageous feature of low electron temperature as a result of excitation of the plasma by using a microwave, and it becomes possible to avoid the problem of damages or metal contamination caused in the substrate. Further, it becomes possible to excite uniform plasma over a substrate of large area, and thus, the plasma processing apparatus can easily handle the fabrication of semiconductor devices on a large-diameter semiconductor wafer or fabrication of large flat panel display devices.

BACKGROUND ART

Figure 1:
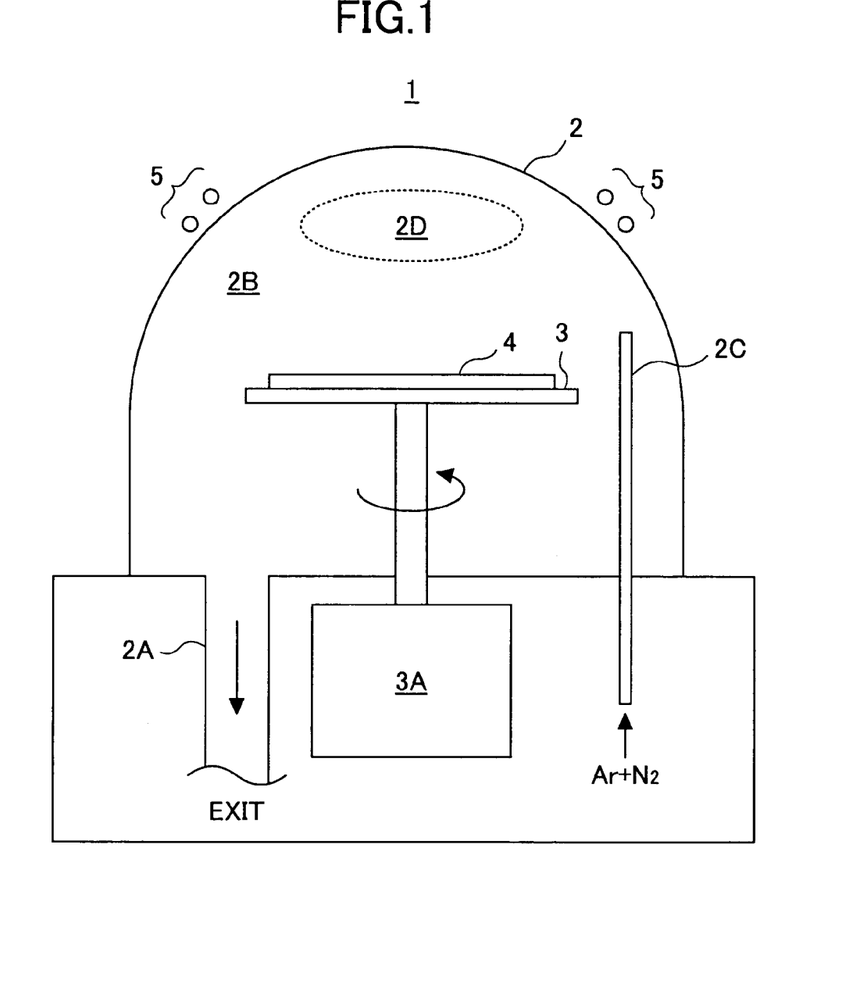
FIG. 1 is a diagram showing the construction of a conventional induction coupled plasma processing apparatus.

FIG. 1 shows the schematic construction of a conventional induction-coupled plasma processing apparatus 1.

Referring to FIG. 1, the plasma processing apparatus 1 includes a processing vessel 2 of a quartz dome evacuated by an evacuation line 2A, and there is provided a stage 3 in a process space 2B defined by the processing vessel 2 such that the stage 2 is rotated by a rotating mechanism 3A. Further, a substrate 4 is held on the stage 3. Further, an inert gas such as Ar and a process gas such as oxygen or nitrogen are supplied to the process space 2B via a process gas supply line 2C. Further, there is provided a coil 5 around the top part of the processing vessel 2 at the outside thereof, and high-density plasma 2D is inducted at the top part of the process space 2B by driving the coil 5 by a d.c. power source.

In the plasma processing apparatus 1 of FIG. 1, the radicals of the process gas formed with the high-density plasma 2D reach the surface of the substrate 4 and the substrate processing such as oxidation or nitridation is achieved.

In such a conventional induction-coupled plasma processing apparatus 1, on the other hand, there exists a drawback in that the high-density plasma 2D is localized at the top part of the processing vessel and there appears an extremely non-uniform distribution in the radicals that are formed with the plasma. Particularly, the non-uniformity of the radical concentration in the radial direction of the substrate is not resolved even when the stage 3 is rotated by the rotating mechanism 3A.

Thus, in the conventional induction-coupled plasma processing apparatus 1, the plasma processing apparatus was designed such that the substrate 4 is separated from the region in which the high-density plasma 2D is formed with a large distance for realizing as uniform radical concentration distribution as possible at the surface of the substrate 4. As a result of such a construction, on the other hand, the overall size of the substrate processing apparatus 1 is increased inevitably. Further, the amount of the radicals reaching the substrate 4 is reduced. These problems become particularly serious in the technology of current trend of processing a large-diameter substrate.

On the other hand, there is a proposal of a microwave plasma processing apparatus that uses high-density plasma induced, not by an induction magnetic field but by a microwave electric field. For example, there is proposed a plasma processing apparatus that uses a planar antenna (radial line slot antenna) having a large number of slots arranged so as to produce a uniform microwave, for emitting a microwave into a processing vessel. In this apparatus, the microwave electric field thus induced is used to excite plasma by causing ionization in the gas in the vacuum vessel. Reference should be made to Japanese Laid-Open Patent Application 9-63793. By using the microwave plasma excited according to such a process, it becomes possible to realize a high-plasma density over a wide area right underneath the antenna, and uniform plasma processing becomes possible with short time period. Further, the microwave plasma thus excited has an advantageous feature of low electron temperature as a result of excitation of the plasma by using a microwave, and it becomes possible to avoid the problem of damages or metal contamination caused in the substrate. Further, it becomes possible to excite uniform plasma over a substrate of large area, and thus, the plasma processing apparatus can easily handle the fabrication of semiconductor devices on a large-diameter semiconductor wafer or fabrication of large flat panel display devices.

Figure 2:
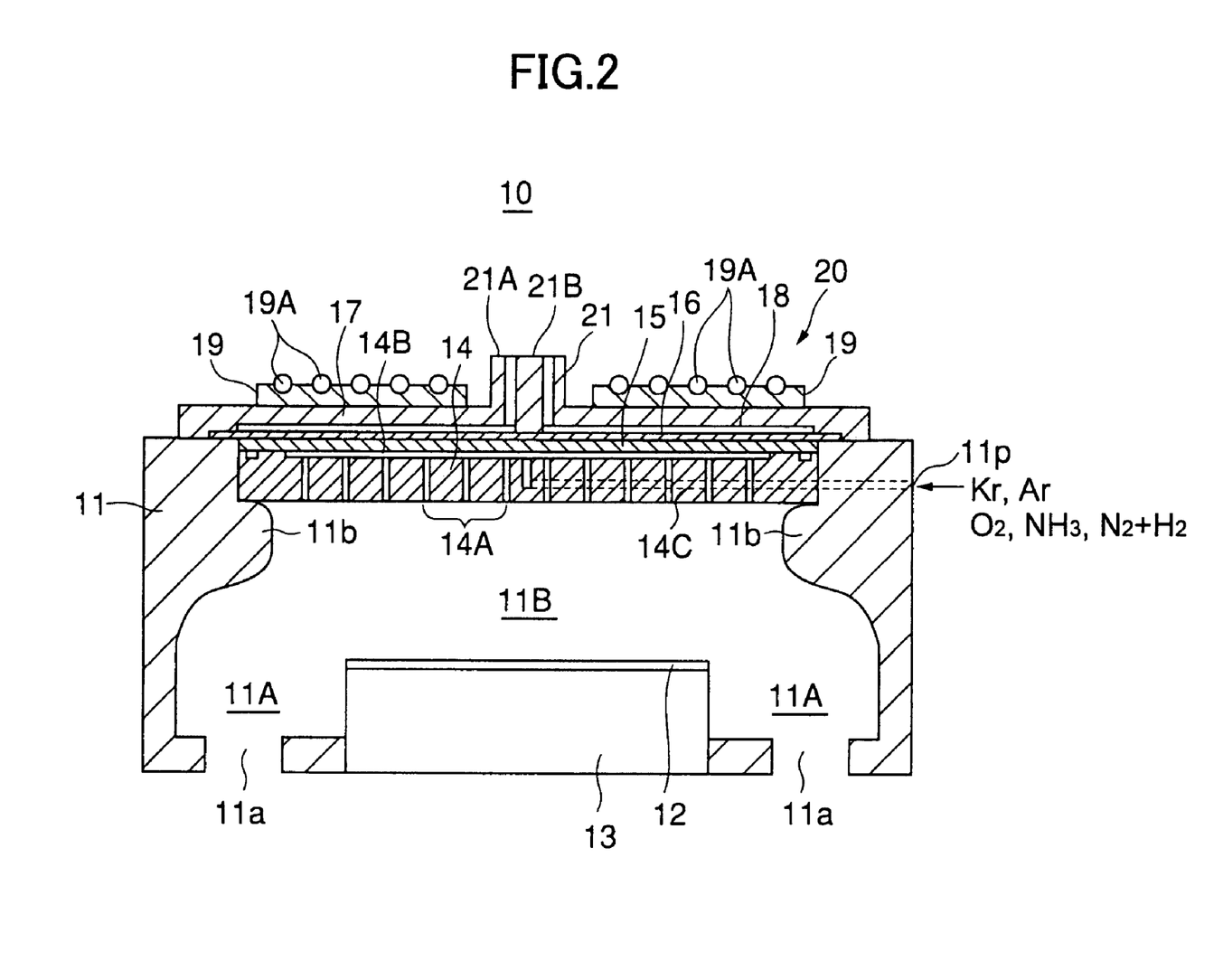
FIG. 2 is a diagram showing the construction of a previously proposed microwave substrate processing apparatus.

FIG. 2 shows the construction of a microwave plasma processing apparatus 10 that uses such a radial line slot antenna as proposed before by the inventor of the present invention.

Referring to FIG. 2, the microwave plasma processing apparatus 10 includes a processing chamber 11 evacuated at a plurality of evacuation ports 11a, and there is provided a stage 13 inside the processing chamber 11 for supporting a substrate 12 to be processed. In order to achieve uniform evacuation of the processing chamber 11, there is provided a ring-shaped space 11A around the stage 13, and the processing chamber 11 is evacuated uniformly via the space 11A and further via the evacuation ports 11a by arranging the evacuation ports 11a communicating with the space 11A in axial symmetry with respect to the substrate.

On the processing chamber 11, there is provided a plate-like shower plate 14 formed of a low-loss dielectric such as $Al_2O_3$ or $SiO_2$ as a part of the outer wall of the processing chamber 11 at a location facing the substrate 12 held on the stage 13, wherein the shower plate 14 is provided via a seal ring not illustrated and includes a number of apertures 14A. Further, a cover plate 15 also of a low-loss dielectric such as $Al_2O_3$ or $SiO_2$ is provided at the outer side of the shower plate 14 via another seal ring not illustrated.

The shower plate 14 is provided with a gas passage 14B at a top surface thereof, and each of the apertures 14A are provided so as to communicate with the gas passage 14B. Further, there is provided a gas supply passage 14C in the interior of the shower plate 14 in communication with a gas supply port 11p provided at an outer wall of the processing vessel 11. Thus, the plasma-excitation gas such as Ar or Kr supplied to the gas supply port 11p is forwarded to the apertures 11A via the supply passage 14C and further via the passage 14B and is released to the process space 11B right underneath the shower plate 14 inside the processing vessel 11 from the foregoing apertures 14A.

On the processing vessel 11, there is further provided a radial line slot antenna 20 at the outer side of the cover plate 15 with a separation of 4-5 mm from the cover plate 15. The radial line slot antenna 20 is connected to an external microwave source (not illustrated) via a coaxial waveguide 21 and causes excitation of the plasma-excitation gas released into the process space 11B by the microwave from the microwave source. It should be noted that the cover plate 15 and the radiation surface of the radial line slot antenna are contacted closely, and there is provided a cooling block 19 on the antenna 20 for cooling the antenna. The cooling block 19 includes a cooling water passage 19A.

The radial line slot antenna 20 is formed of a flat, disk-shaped antenna body 17 connected to an outer waveguide tube 21A of the coaxial waveguide 21 and a radiation plate 16 provided at the opening of the antenna body 17, wherein the radiation plate 16 is formed with a number of slots and a retardation plate of a dielectric plate having a constant thickness is interposed between the antenna body 17 and the radiation plate 16.

In the radial line slot antenna 20 having such a construction, the microwave fed thereto from the coaxial waveguide 21 propagates along a path between the disk-shaped antenna body 17 and the radiation plate 16 in the radial direction, wherein the microwave thus propagating undergoes compression of wavelength as a result of the existence of the retardation plate 18. Thus, by forming the slots concentrically in correspondence to the wavelength of the microwave thus propagating in the radial direction, and by forming the slots so as to form a perpendicular angle with each other, it becomes possible to emit a plane wave having a circular polarization from the radial line slot antenna 20 in the direction substantially perpendicular to the radiation plate 16.

By using such a radial line slot antenna 20, there is formed uniform high-density plasma in the process space 11B right underneath the shower plate 14. The high-density plasma thus formed has a feature of low electron temperature and the occurrence of damages in the substrate 12 to be processed is avoided. Further, there occurs no metal contamination caused by sputtering of the chamber wall of the processing vessel 11.

Thus, by supplying a process gas, such as an $O_2$ gas, an $NH_3$ gas, or a mixed gas of an $N_2$ gas and an $H_2$ gas, to the gas inlet port 11p of the substrate processing apparatus 10 of FIG. 2 in addition to the plasma-excitation gas such as Ar or Kr, there is caused an excitation of active species such as atomic state oxygen O* or hydrogen nitride radicals NH* in the process space 11B by the high-density plasma, and it becomes possible to conduct oxidation processing, nitridation processing or oxynitridation processing on the surface of the substrate 12.

Figure 3:
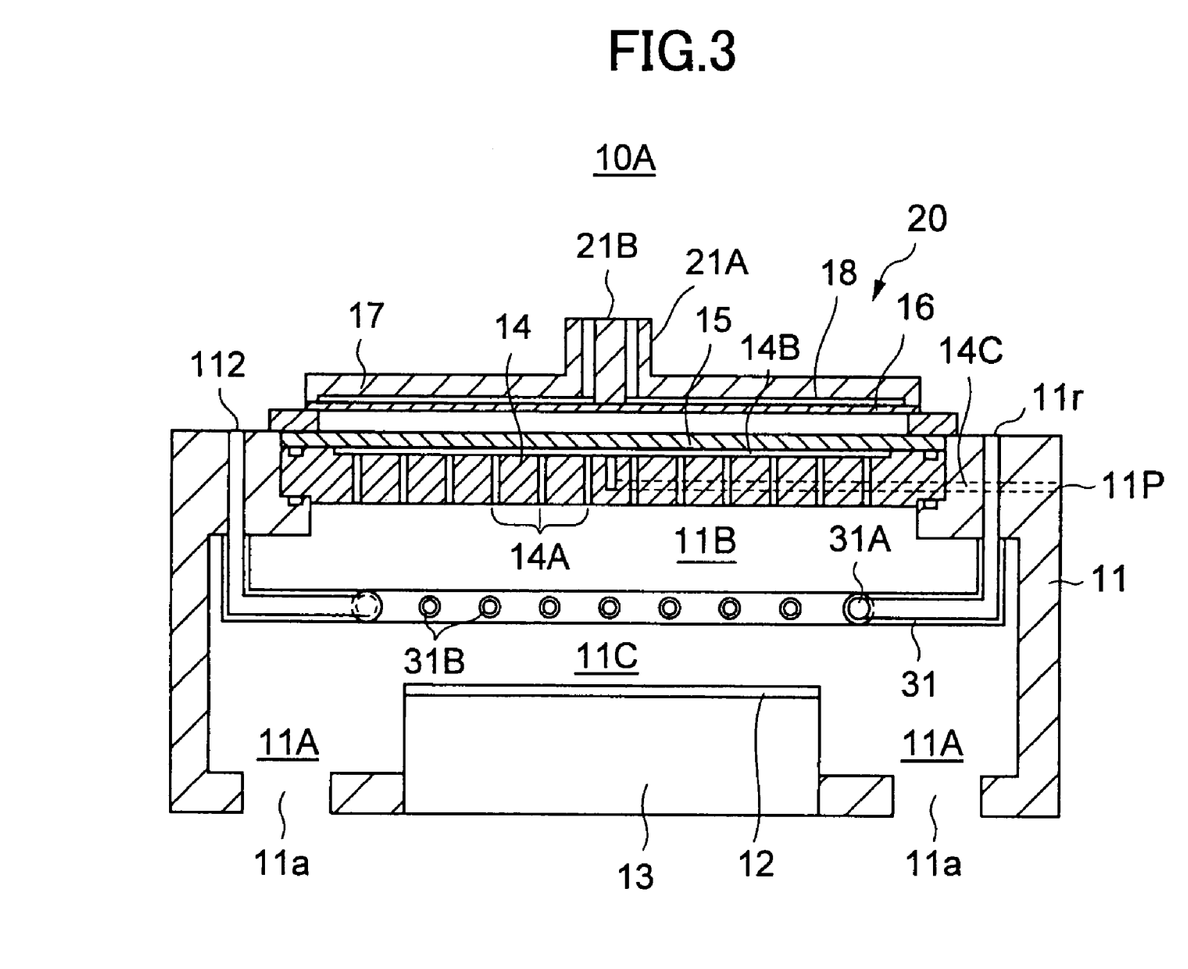
FIG. 3 is a diagram showing the construction of another previously proposed microwave substrate processing apparatus.

Further, there is proposed a substrate processing apparatus 10A shown in FIG. 3 having a construction similar to the substrate processing apparatus 10 of FIG. 2 except that there is provided a lower shower plate 31 at the lower side of the shower plate 14. The lower shower plate 31 is provided with a process gas passage 31A communicating with a process gas inlet port 11r formed at the surface of the processing vessel 1 and a large number of process gas inlet nozzle openings 31B are formed in communication with the process gas passage 31A. Further, the lower shower plate 31 is provided with large apertures for passing the process gas radicals formed in the space 11B.

Thus, in the substrate processing apparatus 10A of FIG. 3, there is defined another process space 11C underneath the lower shower plate 31. By forming the lower shower plate 31 by a conductive material such as a stainless steel having a passivation surface by aluminum oxide ($Al_2O_3$) in such an apparatus, it becomes possible to block the penetration of microwave to the process space 11C. Thereby, the excitation of plasma is limited in the process space 11B right underneath the upper shower plate 14, and the radicals Kr* of Kr or Ar* of Ar penetrate into the process space 11C through the large apertures formed in the shower plate 31 after excitation in the space 11B. The radicals Kr* or Ar* thus penetrated into the process space 11C cause activation of the process gas released from the nozzle apertures 31B, and the processing of the substrate 12 is achieved by the process gas radicals thus activated.

In the substrate processing apparatus 10A of FIG. 3, it should be noted that the microwave is expelled from the process space 11C by forming the lower shower plate 31 by a conductive material, and the damaging of the substrate by microwave is avoided.

In the substrate processing apparatus 10A of FIG. 3, it is also possible to conduct a plasma CVD process by introducing a CVD source gas from the lower shower plate 31. Further, it is possible to conduct a dry etching process by introducing a dry etching gas from the lower shower plate 31 and applying a high-frequency bias to the stage 13.

Thus, in the substrate processing apparatus of FIG. 2 of FIG. 3, Kr radicals (Kr*) of intermediate excitation state having an energy of about 10 eV are excited at the time of conducting an oxidation processing, by introducing a Kr gas and an oxygen gas into the process space 11B. The Kr radicals thus excited cause efficient excitation of atomic state oxygen O* according to the reaction $$O_2 \rightarrow O^* + O^*,$$

while the atomic state oxygen O* thus excited cause the desired oxidation of the surface of the substrate 12.

In the case of conducting a nitridation processing of the substrate 12, a Kr gas and an ammonia gas, or a Kr gas and a nitrogen gas and a hydrogen gas are introduced. In this case, the excited Kr radicals (Kr*) or Ar radicals (Ar*) cause the excitation of hydrogen nitride radicals NH* according to the reaction $$NH_3 \rightarrow NH^* + 2H^* + e^-,$$

or $$N_2 + H_2 \rightarrow NH^* + NH^*,$$

wherein the hydrogen nitride radicals thus excited cause the desired nitridation processing of the substrate of the surface 12.

Meanwhile, there are cases in which it is preferable to use atomic state nitrogen (N*), free from hydrogen and having a strong nitriding power, at the time of the nitridation processing of the substrate. The atomic state nitrogen N* are formed according to the reaction $$N_2 \rightarrow N^* + N^*,$$

wherein it should be noted that such a reaction requires the energy of 23-25 eV. This means that it is not possible to excite the atomic state nitrogen N* according to the foregoing reaction, as long as Kr or Ar plasma is used. As noted previously, the energy of the Kr radicals or Ar radicals obtained by the Kr or Ar plasma is merely in the order of 10 eV.

Thus, even when there is made an attempt to supply a nitrogen gas in the substrate processing apparatus of FIG. 2 or FIG. 3 in place of the Kr gas or the Ar gas, merely the reaction $$N_2 \rightarrow N_2^+ + e^-,$$

is obtained, and there is caused no desired atomic state oxygen N*.

Figure 4:
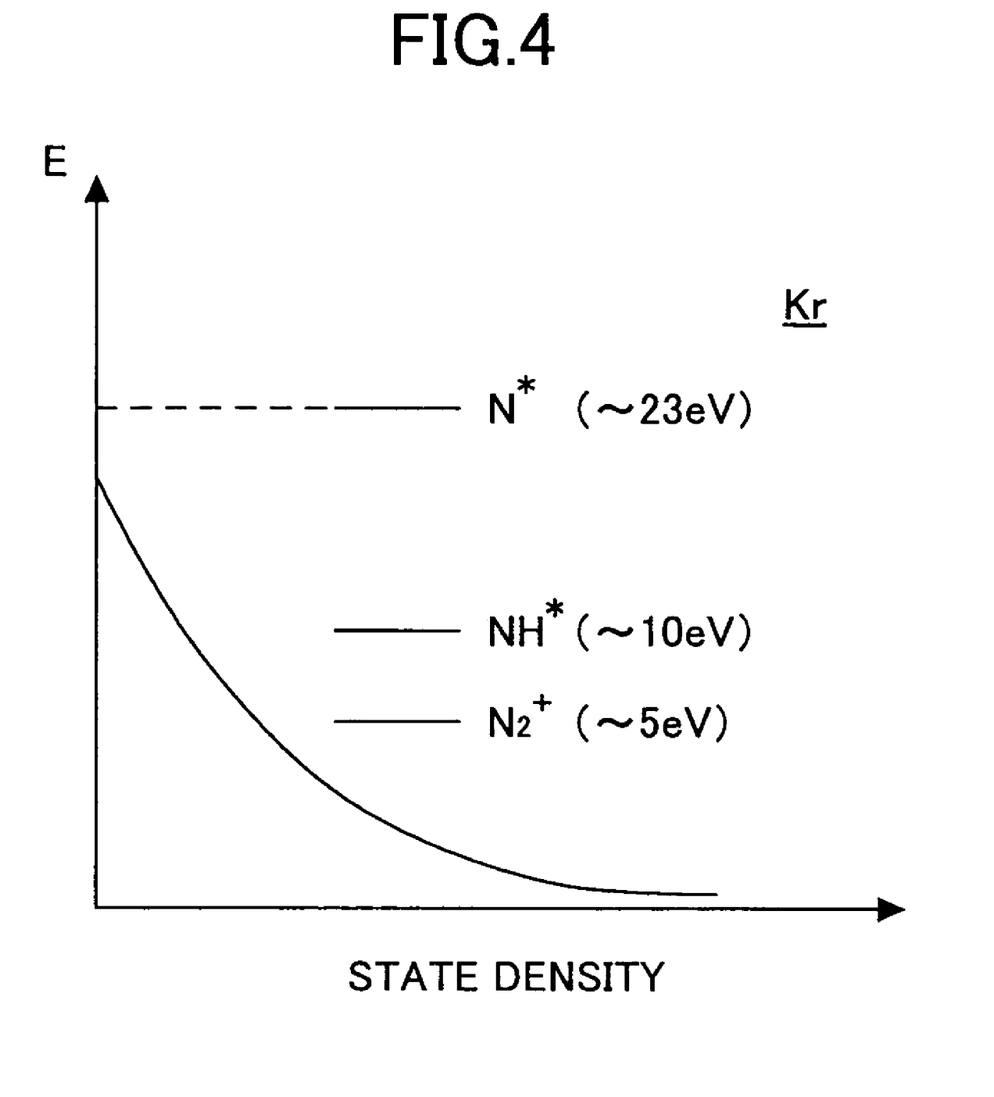
FIG. 4 is a diagram explaining the characteristics of plasma excitation in the microwave substrate processing apparatus of FIG. 2 or FIG. 3.

FIG. 4 shows the relationship between the state density of the Kr plasma and the excitation energy of the atomic state nitrogen N*, hydrogen nitride radicals NH* and nitrogen atoms $N_2^+$.

Referring to FIG. 4, it can be seen that the state density of the Kr plasma is large at the low energy side, while the state density shows a rapid decrease with increase of the energy. Such a plasma cannot achieve efficient excitation of the desired nitrogen radicals.

DISCLOSURE OF THE INVENTION

Accordingly, it is a general object of the present invention to provide a novel and useful substrate processing apparatus wherein the foregoing problems are eliminated.

Another and more specific object of the present invention is to provide a substrate processing method and apparatus capable of forming nitrogen radicals N* efficiently.

Another object of the present invention is to provide a method of processing a substrate by using a substrate processing apparatus which has such a construction that a process space, in which a substrate to be processed is contained, is separated from a plasma formation space, in which the substrate to be processed is not contained, by a control electrode in a processing vessel, characterized by the steps of:

supplying a gas containing He and $N_2$ to said processing vessel;

forming plasma in said plasma formation space under a condition such that there is caused excitation of atomic state nitrogen N* in said plasma; and nitriding a surface of the substrate to be processed by said atomic state nitrogen N* in said process space.

Another object of the present invention is. to provide a substrate processing apparatus, comprising:

a processing vessel defined by an outer wall and having a stage for holding a substrate to be processed thereon;

an evacuation system coupled to said processing vessel;

a plasma gas supplying part supplying a plasma excitation gas and a process gas into said processing vessel;

a microwave window provided on said processing vessel so as to face said substrate to be processed; and a control electrode provided between said substrate to be processed on said stage and said plasma gas supplying part so as to face said substrate to be processed and separating a plasma excitation space containing said microwave window and a process space containing said substrate to be processed, said control electrode comprising a conductive member having a plurality of apertures for passing plasma formed in said processing vessel therethrough, and a surface of said control electrode being covered by any of aluminum oxide or electrically conductive nitride.

Another object of the present invention is to provide a substrate processing apparatus, characterized by:

a processing vessel defined by a wall of quartz glass and having a stage for holding a substrate to be processed;

an evacuation system coupled to said processing vessel;

a plasma gas supplying part supplying a plasma excitation gas and a process gas to said processing vessel;

a control electrode provided so as to face said substrate to be processed on said stage and dividing an interior of said processing vessel into a process space containing said substrate to be processed and a plasma excitation space; and an induction coil provided outside said quartz glass wall in correspondence to said plasma excitation space, said control electrode comprising a conductive member having a plurality of apertures passing therethrough plasma formed in said processing vessel, and a surface of said control electrode being covered with any of aluminum oxide or electrically conductive nitride.

According to the present invention, it becomes possible to form plasma having the energy sufficient for causing excitation of atomic state nitrogen N* in the substrate processing apparatus by using He for the plasma excitation gas, and it becomes possible to conduct an efficient nitridation of the substrate by using the atomic state nitrogen N* thus excited. By separating the plasma excitation space in which the high-density plasma is excited from the process space in which the substrate is included by means of the control electrode, it becomes possible to reduce the plasma energy in the process space to the level suitable for substrate processing. Further, it becomes possible to trap the positive ions formed in the plasma excitation space. In the case of applying the present invention to the substrate processing apparatus that uses microwave-excited plasma, it becomes possible to avoid excessive increase of the plasma energy by conducting the plasma excitation by using a microwave having the frequency of about 28 GHz or more.

DETAILED DESCRIPTION OF THE PREFERRED EMBODIMENTS

[First Embodiment]

Figure 5:
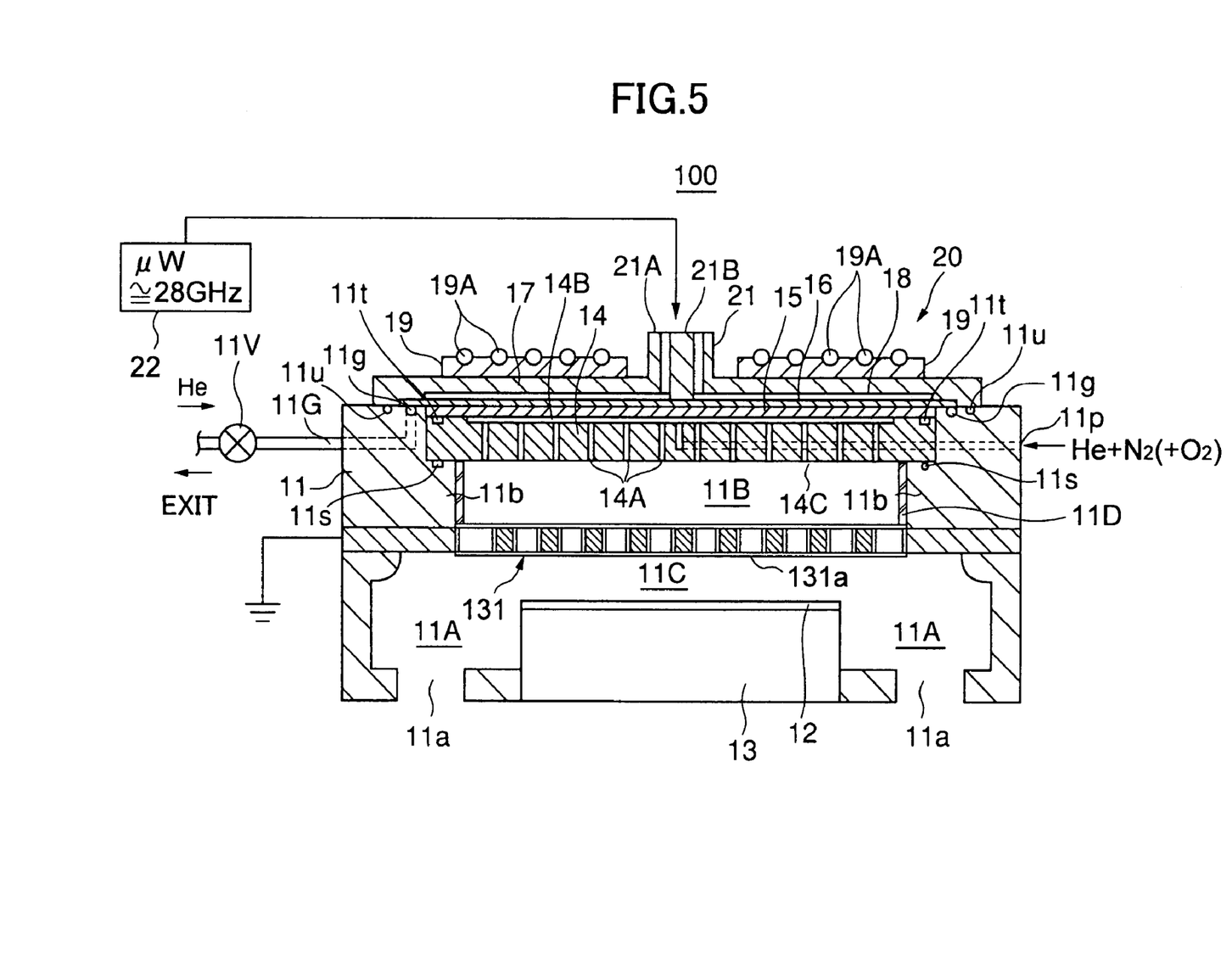
FIG. 5 is a diagram showing the construction of a microwave substrate processing apparatus according to a first embodiment of the present invention.

FIG. 5 shows the construction of a substrate processing apparatus 100 according to a first embodiment of the present invention. In FIG. 5, those parts corresponding to the parts described previously are designated by the same reference numerals and the description thereof will be omitted.

Referring to FIG. 5, the shower plate 14 is mounted on the processing vessel 11 via a seal 11s, and the cover plate 15 is mounted on the shower plate 14 via a seal 11t. Further, the radial line slot antenna 20 is mounted on the processing vessel 11 via a seal 11u.

Further, in the substrate processing apparatus 100 of FIG. 5, the interface between the emission plate 16 and the cover plate 15 is evacuated via a ring-shaped groove 11g formed at the top part of the processing vessel 11 in the region where the processing vessel makes an engagement with the emission plate and further via an evacuation port 11G communicating with the ring-shaped groove 11g. After evacuation, a He gas is introduced into the foregoing interface with a pressure of about 0.8 atmospheres as a thermal conducting medium. The He gas thus introduced is confined therein by closing the valve 11V.

Figure 6:
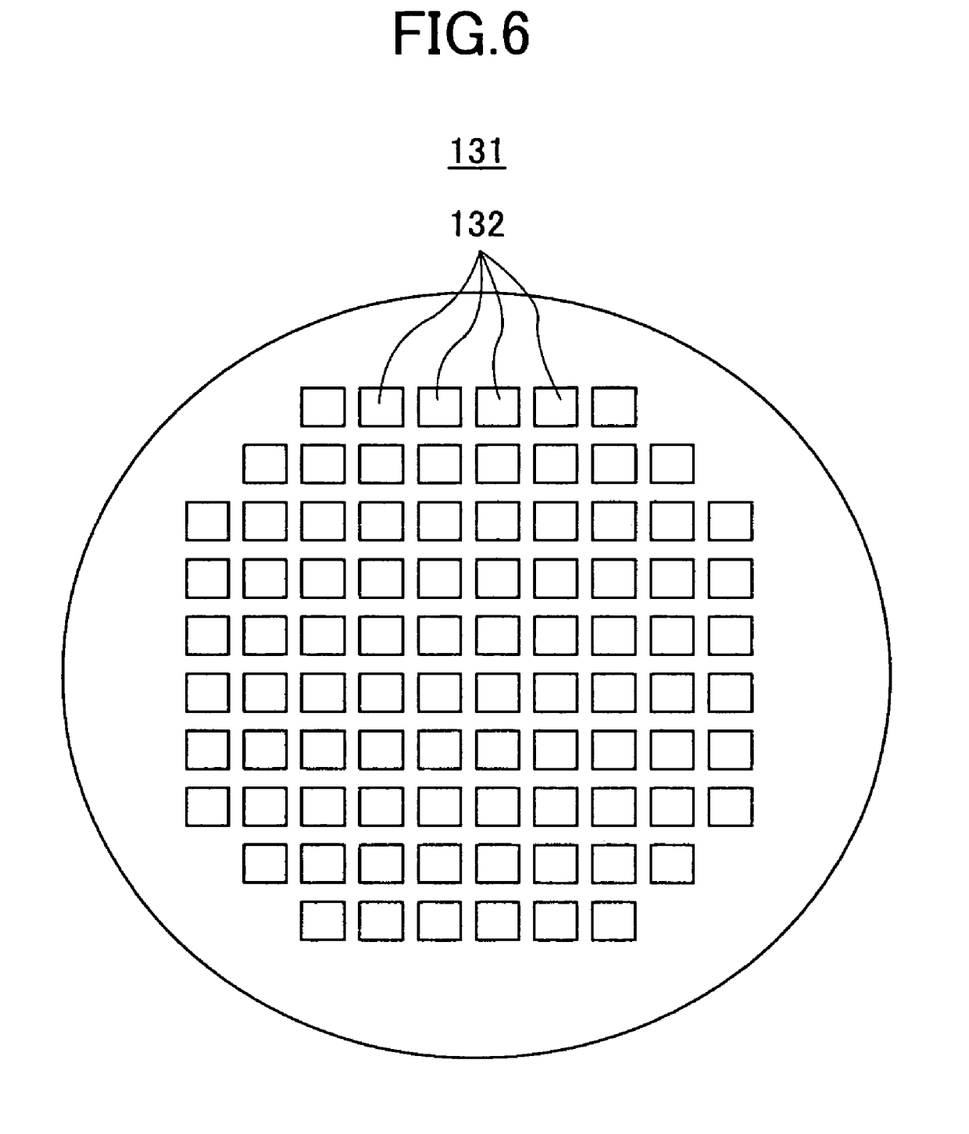
FIG. 6 is a diagram showing a part of the microwave substrate processing apparatus of FIG. 5.

In the substrate processing apparatus 100 of FIG. 5, it should be noted that the lower shower plate 31 used in the substrate processing apparatus 10A of FIG. 3 is removed and a control electrode 131 of a conductive member is formed, wherein the control electrode 31 has a lattice shape as represented in FIG. 6 and is formed so as to separate the plasma excitation space 11B and the process space 11C.

Referring to FIG. 6, the lattice-shaped control electrode 131 is formed with large number of apertures 132 having a size set such that there occurs free passage of the radicals excited in the plasma excitation spate 11B, and thus, the plasma excited in the plasma excitation space 11B cause diffusion freely into the process space 11C through the control electrode 131.

In the construction of FIG. 5, it should be noted that the lattice-shaped control electrode 131 is grounded, and thus, the microwave introduced into the plasma excitation space 11B from the radial line slot antenna 11B is reflected by the lattice shaped control electrode 131, and there is caused no invasion of the microwave into the process space 11C. Thus, the problem of the microwave causing damages in the substrate 12 is not caused in the substrate processing apparatus 100 of FIG. 5.

It should be noted that the lattice-shaped control electrode 131 can be formed by W, Ti, or the like, wherein it is possible to increase the resistance against plasma irradiation by forming a layer 131a of a conductive nitride such as WN or TiN on the surface thereof. Further, it is possible to form such a lattice-shaped control electrode 131 by using a quartz glass and provide the conductive nitride layer 131a on the surface thereof. Further, in the substrate processing apparatus 100, it should be noted that the sidewall surface of the processing vessel 11 is covered by a quartz liner 11D for the part corresponding to the plasma excitation space 11B.

In the substrate processing apparatus 100 of FIG. 5, a He gas and an $N_2$ gas are introduced to the process gas inlet port 11p, and a microwave of about 28 GHz is supplied to the radial line slot antenna. Typically, the process pressure in the processing vessel 11 is set to the range of 66.5-266 Pa (0.5-2 Torr), and nitridation processing or oxynitridation processing of the substrate 12 is conducted in the temperature range of 200-500° C.

Figure 7:
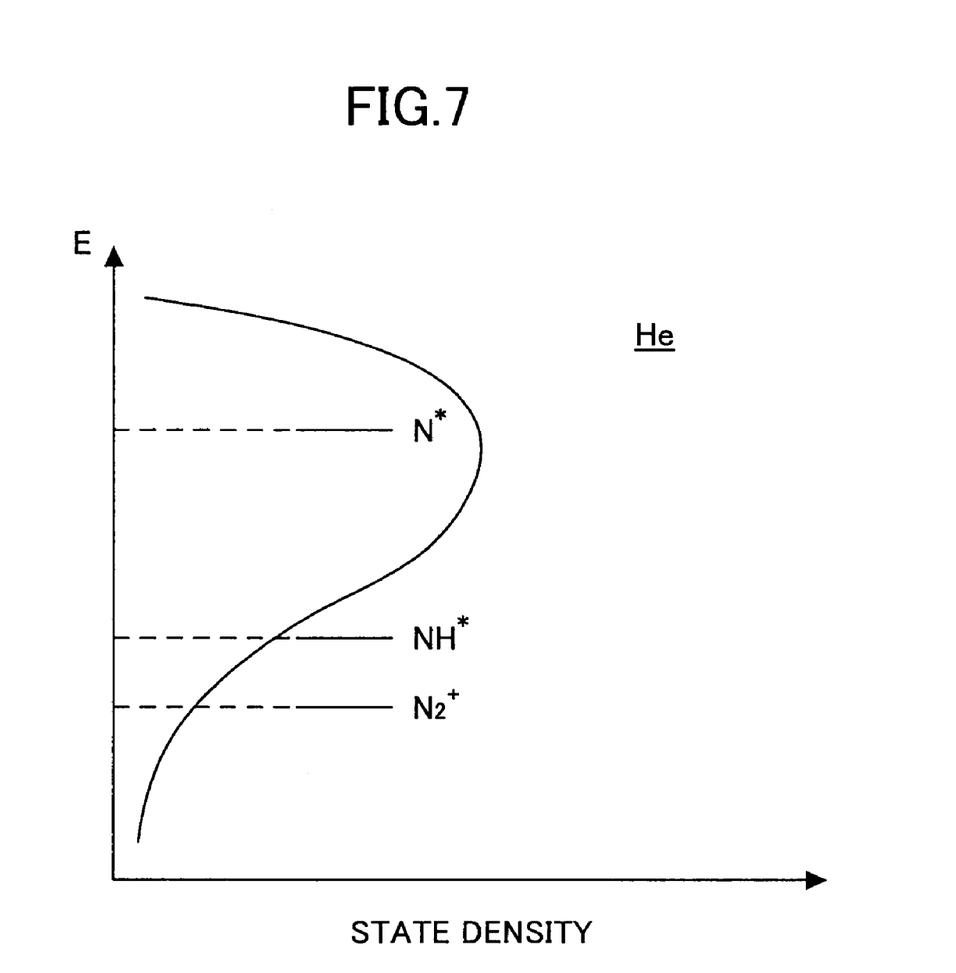
FIG. 7 is a diagram showing the characteristics of plasma excitation in the microwave substrate processing apparatus of FIG. 5.

FIG. 7 shows the state density of the plasma excited in the substrate processing apparatus 100 of FIG. 5 for the case He is used for the plasma gas.

Referring to FIG. 7, it should be noted that the use of He having a characteristically small collision cross-section for the plasma gas causes significant acceleration in the excited He radicals He* with the microwave electric field, and as a result, there is caused significant increase of plasma energy to the level suitable for excitation of the atomic state nitrogen N*. On the other hand, it can be seen that the efficiency of excitation of the hydrogen nitride radicals NH* or nitrogen ions $N_2^+$, which are excited efficiently in the case Kr is used for the plasma gas, is reduced significantly.

Thus, in the present invention, efficient excitation of the atomic state nitrogen N* is achieved in the substrate processing apparatus 100 at the high plasma energy of 23-25 eV by using He for the plasma gas. In order to avoid excessive increase of the electron temperature in the plasma, the present invention uses a microwave source 22 that produce a microwave of the frequency higher than the previously proposed frequency, such as about 28 GHz or more, for driving the radial line slot antenna 20. Thereby, it is possible to select the frequency of the microwave source from the frequencies such as about 2.4 GHz or about 8.3 GHz. Further, by separating the plasma excitation space 11B and the process space 11C by the control electrode 131, it is possible to reduce the electron temperature and the plasma energy to a level suitable for substrate processing.

Particularly, it should be noted that the control electrode is protected effectively from the high-energy plasma by forming a conductive nitride such as an $Al_2O_3$ passivation film on the surface of the control electrode 131 as explained already. Further, the problem of sputtering of the inner wall of the processing vessel by the high-energy plasma and the associated problem of contamination of the substrate are avoided by covering the inner wall of the processing vessel 11 by a quartz liner 11D for the part corresponding to the plasma excitation region 11B.

Figure 8:
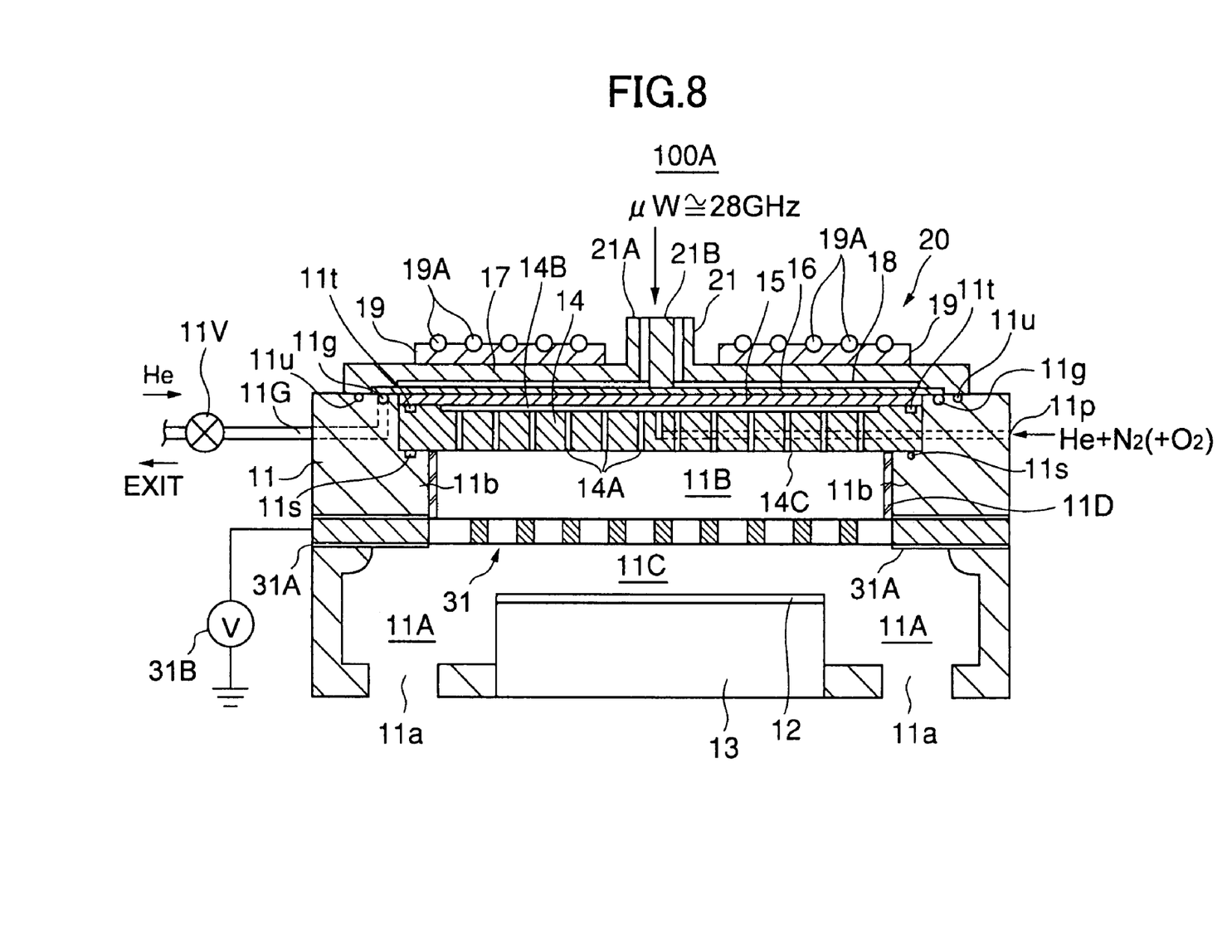
FIG. 8 is a diagram showing a modification of the microwave plasma processing apparatus of FIG. 5.

FIG. 8 shows the construction of a substrate processing apparatus 100A according to a modification of the present embodiment.

Referring to FIG. 8, it becomes possible in the substrate processing apparatus 100A to capture the nitrogen ions $N_2^+$ excited in the plasma excitation space 11B with the positive electric charge, by controlling the potential of the control electrode 31 to a suitable negative potential value. Thereby, penetration of the nitrogen ions $N_2^+$ into the process space 11C is avoided.

In the substrate processing apparatus 100 or 100A of the present embodiment, it is possible to conduct an oxynitridation processing of the substrate 12 by supplying a He gas, an $N_2$ gas and an $O_2$ gas to the plasma gas supply port 11p.

[Second Embodiment]

Figure 9:
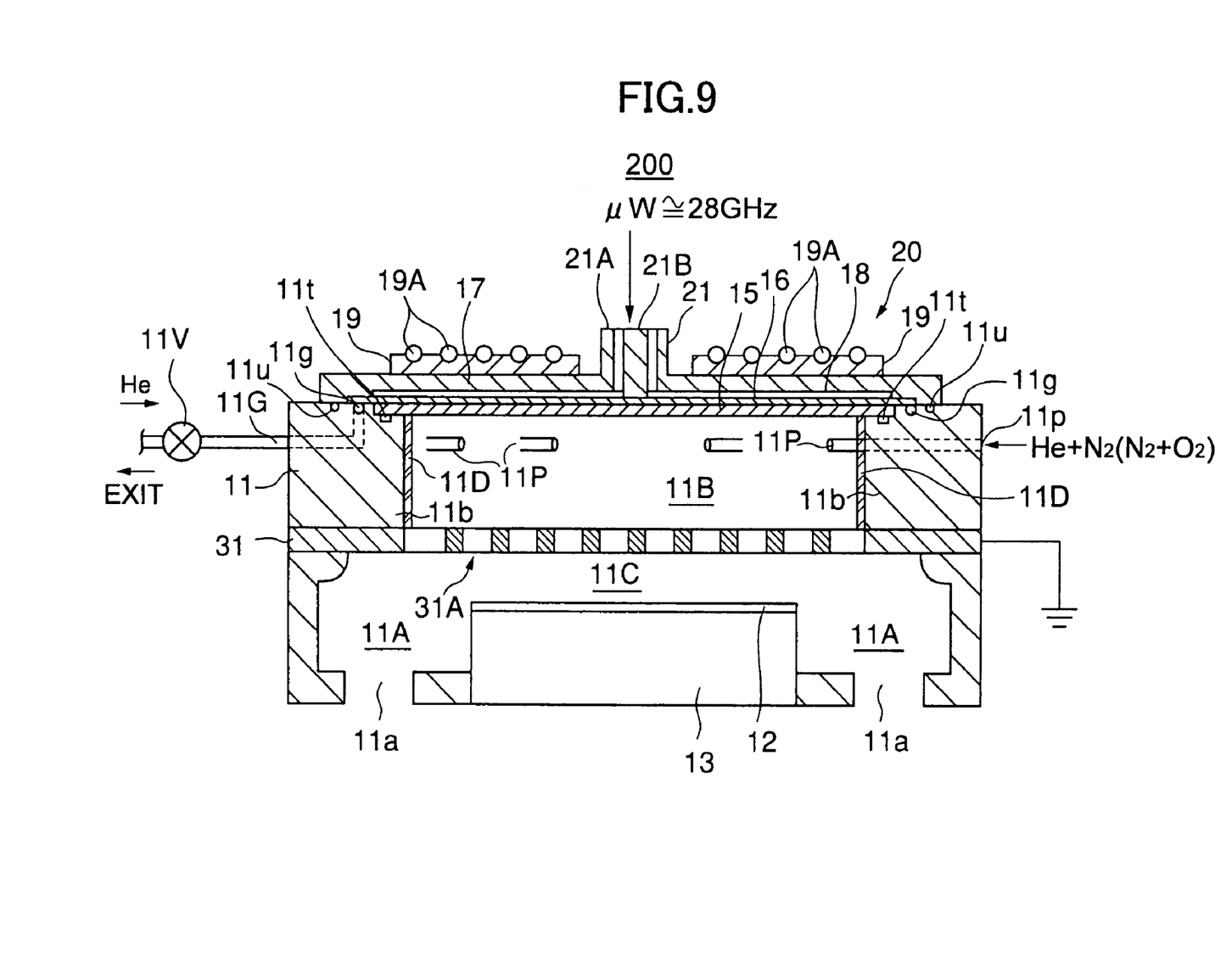
FIG. 9 is a diagram showing the construction of a microwave plasma processing apparatus according to a second embodiment of the present invention.

FIG. 9 shows the construction of a substrate processing apparatus 200 according to a second embodiment of the present invention. In FIG. 9, those parts corresponding to the parts described previously are designated by the same reference numerals and the description thereof will be omitted.

Referring to FIG. 9, it should be noted that the shower plate 14 is removed in the present embodiment, and in place of this, there are provided a plurality of process gas inlet ports lip on the processing vessel 11 such that the process gas inlet ports 11P are disposed with a symmetric relationship with respect to the substrate 12. As a result, therefore, the cover plate 15 constituting the dielectric window is exposed at the top part of the plasma excitation space 11B. Further, the sidewall surface of the processing vessel is covered by the quartz liner 11D for the part corresponding to the plasma excitation space 11B similarly to the previous embodiment.

According to the present embodiment, the construction of the substrate processing apparatus 11 is simplified, and it becomes possible to conduct the nitridation processing of the substrate 12 efficiently with low cost by using the atomic state nitrogen N*, by supplying a He gas and an $N_2$ gas to the plasma gas supplying port lip and by supplying the microwave of about 28 GHz to the radial line slot antenna 20. Further, it is possible to conduct an oxynitridation processing by supplying a He gas, an $N_2$ gas and an $O_2$ gas to the plasma gas supplying port 11p.

[Third Embodiment]

Figure 10:
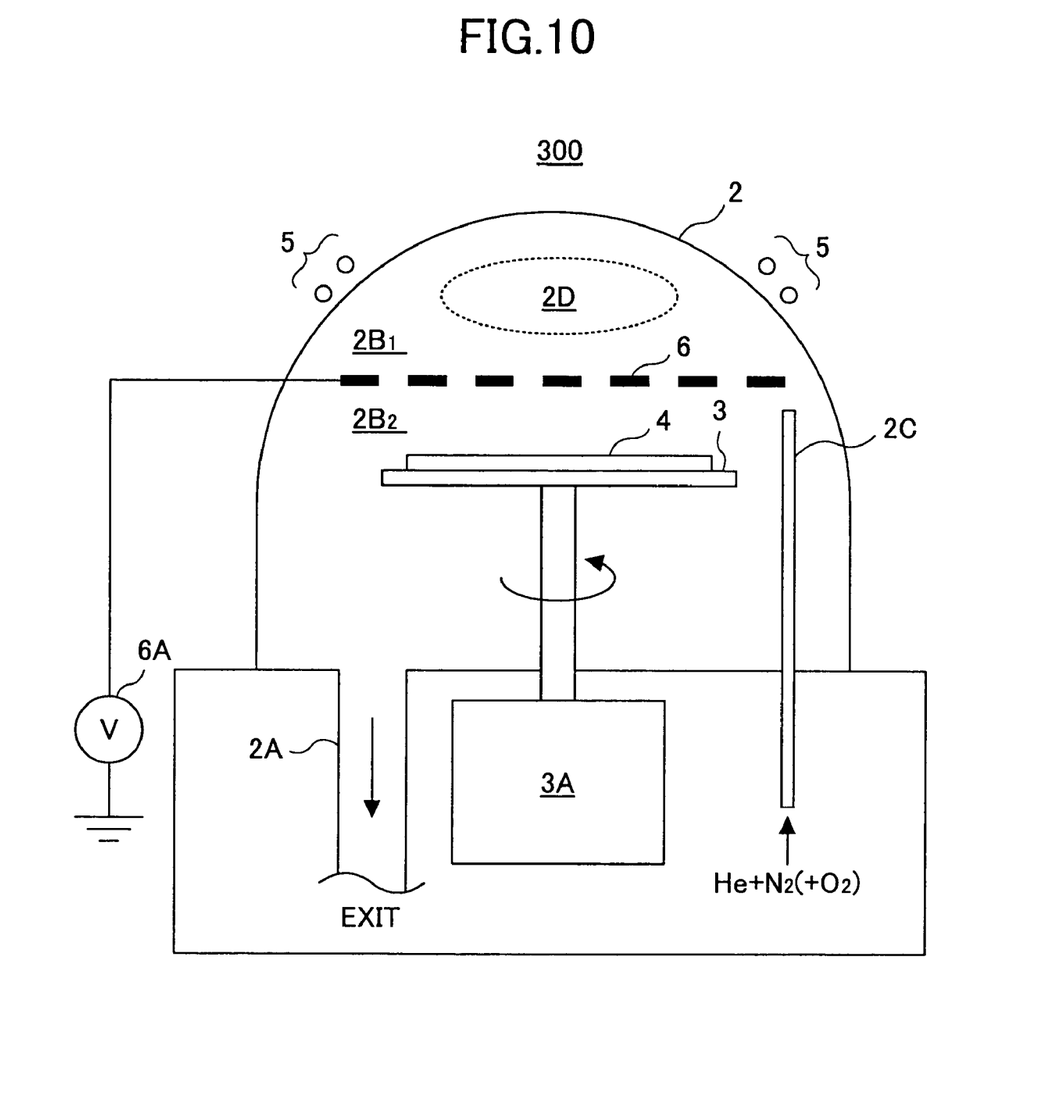
FIG. 10 is a diagram showing the construction of an induction coupled plasma processing apparatus according to a third embodiment of the present invention.

FIG. 10 shows the construction of a substrate processing apparatus 300 according to a third embodiment of the present invention. In FIG. 10, those parts corresponding to the parts described previously are designated by the same reference numerals and the description thereof will be omitted.

Referring to FIG. 10, the substrate processing apparatus 300 has a construction similar to the substrate processing apparatus 1 explained before with reference to FIG. 1, except that a control electrode 6 similar to the control electrode 31 is provided in the quartz vessel 2, and the space inside the quartz vessel 2 is divided by the control electrode 6 into a plasma excitation space 2B1 in which the high-density plasma 2D is excited and a process space 2B2 that includes the substrate 4 to be processed.

In the present embodiment, a He gas and an $N_2$ gas are introduced into the plasma excitation space 2B1 via the process gas supply line 2C, and there is formed high-density plasma 2D having a high electron temperature and plasma energy sufficient for exciting atomic state nitrogen N* in the plasma excitation space 2B1.

The atomic state nitrogen N* thus formed cause diffusion into the process space 2C through the control electrode 6, and the surface of the substrate 4 undergoes nitridation. In such a construction, it should be noted that the plasma has a very high electron temperature and energy in the plasma excitation space 2B1, while the electron temperature and the energy of the plasma are reduced to the level suitable for processing the substrate 4 in the process space 2B2.

In the present embodiment, too, it becomes possible to remove the low energy positive ions such as $N_2^+$ formed in the plasma excitation space 2B1 from the process space 2B2 by trapping the same, by controlling the potential of the control electrode 6 by the voltage source 6A. Further, it becomes possible to control the state of the high-density plasma 2D in the plasma excitation space 2B1 by controlling the potential of the control electrode 6.

In the substrate processing apparatus 200 of the present embodiment, it is also possible to conduct an oxynitridation processing of the substrate 4 in the process space $2B_2$ by introducing a He gas and an $N_2$ gas and an $O_2$ gas from the process gas supply line 2C.

Further, the present invention is not limited to the specific preferred embodiments described heretofore, but various variations and modifications may be made without departing from the scope of the invention recited in the claims.

INDUSTRIAL APPLICABILITY

According to the present invention, it becomes possible to form plasma having the energy sufficient for causing excitation of atomic state nitrogen N* in the substrate processing apparatus by using He for the plasma excitation gas, and it becomes possible to conduct an efficient nitridation of the substrate by using the atomic state nitrogen N* thus excited. By separating the plasma excitation space in which the high-density plasma is excited from the process space in which the substrate is included by means of the control electrode, it becomes possible to reduce the plasma energy in the process space to the level suitable for substrate processing. Further, it becomes possible to trap the positive ions formed in the plasma excitation space. In the case of applying the present invention to the substrate processing apparatus that uses microwave-excited plasma, it becomes possible to avoid excessive increase of the plasma energy by conducting the plasma excitation by using a microwave having the frequency of about 28 GHz or more.

The invention claimed is:

1. A method of processing a substrate by using a substrate processing apparatus which has such a construction that a process space, in which a substrate to be processed is contained, is separated from a plasma formation space, in which the substrate to be processed is not contained, by a control electrode in a processing vessel, wherein said control electrode is formed of a conductive plate having plural apertures, comprising the steps of:

supplying a gas containing $N_2$ to said processing vessel;

forming plasma in said plasma formation space by applying a microwave thereto under a condition such that there is caused excitation of atomic state nitrogen N* in said plasma;

applying a predetermined potential to said control electrode; and nitriding a surface of the substrate to be processed by said atomic state nitrogen N* in said process space, wherein irradiation of said microwave to said substrate is prevented by said control electrode.

2. The substrate processing method as claimed in claim 1, characterized in that said step of forming plasma is conducted such that an intermediate excitation state of the energy of 23 to 25 eV is realized.

3. The substrate processing method as claimed in claim 1, characterized in that said control electrode is grounded during said step of exciting plasma.

4. The substrate processing method as claimed in claim 1, characterized in that a negative potential is supplied to said control electrode in said step of forming plasma.

5. The substrate processing method as claimed in claim 1, wherein said gas supplied to said processing vessel further contains $O_2$.

6. The substrate processing method as claimed in claim 1, characterized in that said step of forming plasma comprises the step of supplying a microwave to said plasma formation space.

7. The substrate processing method as claimed in claim 6, characterized in that said step of supplying a microwave is conducted by driving a radial line slot antenna.

8. The substrate processing method as claimed in claim 1, characterized in that said step of forming plasma comprises the step of forming an induction magnetic field in said plasma formation space.

9. The substrate processing method as claimed in claim 8, characterized in that said step of forming an induction magnetic field comprises the step of driving an induction coil wound around said processing vessel by a high frequency electric power.

* * * * *